United States Patent

Sunkler

[11] 4,075,580
[45] Feb. 21, 1978

[54] MICROWAVE TRANSISTOR OSCILLATOR FOR WIDE BAND FREQUENCY TUNING

[75] Inventor: Anton Sunkler, Otterfing, Germany

[73] Assignee: Siemens Aktiengesellschaft, Berlin & Munich, Germany

[21] Appl. No.: 742,665

[22] Filed: Nov. 17, 1976

[30] Foreign Application Priority Data

Dec. 18, 1975 Germany .............................. 2557134

[51] Int. Cl.² ................................................ H03B 5/18
[52] U.S. Cl. ................................ 331/96; 331/117 R; 331/117 D; 331/177 V
[58] Field of Search ................. 331/96, 117 R, 117 D, 331/177 V

[56] References Cited

U.S. PATENT DOCUMENTS

| | | | |
|---|---|---|---|
| 3,270,292 | 8/1966 | Harwood | 331/117 D X |
| 3,649,937 | 3/1972 | Carlson | 331/117 D X |
| 4,010,428 | 3/1977 | Sunkler | 331/117 D X |

OTHER PUBLICATIONS

Bowman, "S-Band Solid-State Swept Frequency Oscillators," Electronic Engineering, vol. 42, July 1970, pp. 37-41.

*Primary Examiner*—Siegfried H. Grimm
*Attorney, Agent, or Firm*—Hill, Gross, Simpson, Van Santen, Steadman, Chiara & Simpson

[57] ABSTRACT

A transistor oscillator for microwave frequency ranges has a transistor with interelectrode capacitances used for feedback. A series connection of a voltage controlled variable capacitor and line element are connected to the collector of the transistor as a frequency determining element. A line element is connected to the base for feedback and bias means are connected to the base and emitter through high frequency choking means constructed of two quarter wavelength line elements, one of which is arranged in no-load fashion. An attenuation network for frequency selection action is connected to the collector feedback path to dampen the oscillating circuit and prevent frequency jumping of the oscillator outside of the band intended for useful operation.

9 Claims, 7 Drawing Figures

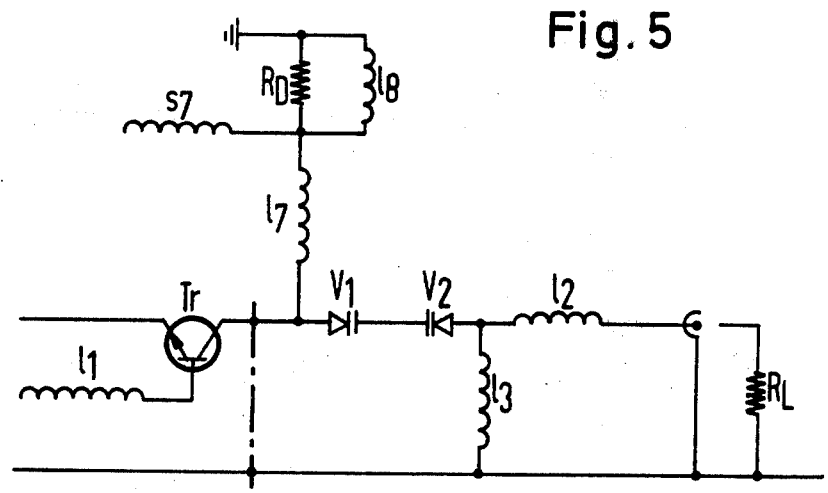

MICROWAVE TRANSISTOR OSCILLATOR FOR WIDE BAND FREQUENCY TUNING

BACKGROUND OF THE INVENTION

1. Field of the Invention

The invention relates to a transistor oscillator for the microwave frequency range embodied as a Clapp oscillator circuit which is a capacitive three-point circuit with a capacitance arranged in series with the circuit inductance.

2. Description of the Prior Art

Of the oscillator circuits customarily used in the microwave art, the Clapp oscillator offers the best possibilities for wide-band frequency tuning since the circuit inductance can be compensated by the reactive impedance of the capacitance. The highest oscillating frequency is obtained from the value of the collector-base capacitance and the smallest circuit inductance. The feedback network consists of capacitive voltage divider between collector and emitter and emitter and base, for which the parasitic collector-emitter and enitter-base capacitances can be used at higher frequencies. The influence of parasitic elements which usually exist in microwave oscillators impairs the wide band behaviour and gives rise to the occurrence of frequency jumping or instability.

SUMMARY OF THE INVENTION

An object of the invention is to eliminate this influence of parasitic elements in microwave oscillators and thus to improve upon the wide-band behavior and also to suppress possible frequency jumping of the oscillator outside the useful band. It is a further object of the invention to construct the transistor oscillator using strip line techniques, with the minimum number of components, and with the smallest possible testing expense.

These objects are realized in a transistor oscillator of the type mentioned above in which a frequency selectively active attenuation network is interposed into the collector d.c. feedback of the transistor which advantageously consists of the series connection of a first $\lambda/4$ line element portion and an attenuator resistor, a short-circuited line element portion which is connected in parallel with the attenuation resistor, and a further no-load $\lambda/4$ line element portion which is connected at the junction of the first line element portion to the parallel circuit.

A transistor oscillator of this type is advantageously constructed in strip line technique, where the HF choking is in each case effected by two $\lambda/4$ line element portions, or in each case a $\lambda/4$ line element portion whose end is short-circuited via a blocking capacitor.

BRIEF DESCRIPTION OF THE DRAWINGS

FIG. 5 is a schematic diagram illustrating the attenuation network in the collector d.c. feedback;

FIG. 6 is an overall circuit diagram of the oscillator;

FIG. 6A is an alternate embodiment for HF choking present in FIG. 6.

DESCRIPTION OF THE PREFERRED EMBODIMENTS

A fundamental component for the construction of the transistor oscillator which can be tuned over a wide band consists of the HF choking network, which, together with the actual high frequency circuit, determines the wide-band behavior of the oscillator. Therefore, the d.c. supply for the varactors, the collector d.c. feedback, and the relevant HF choking network will be explained in detail in the following making reference to partial illustrations of the oscillator circuit. The supply of direct currents to the microwave portion of the circuit must take place via networks which influence the behavior of the microwave portion of the oscillator as little as possible or only in specific properties. These conditions are fulfilled when, at the microwave portion the impedance of the supply line has wide-band characteristics similar to a no-load condition.

Figure 1:
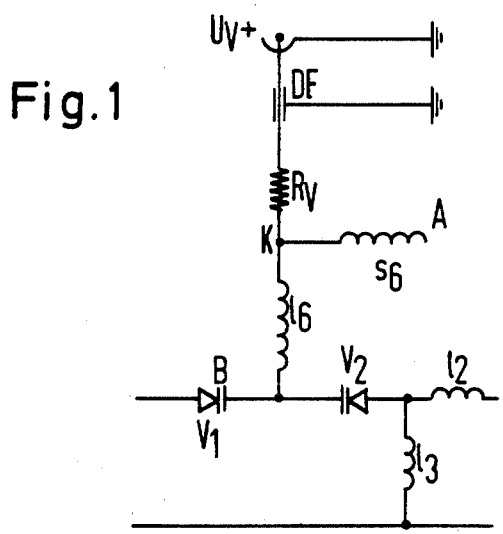
FIG. 1 is a schematic diagram illustrating the d.c. supply for the varactors of the oscillator.

FIG. 1 illustrates the d.c. supply for the varactors V1 and V2. This consists of two $\lambda/4$ line element portions $l_6$ and $s_6$, where the one terminal of the line element portion $l_6$ is connected to the point of connection of the two varactors V1 and V2. The point of connection of the two line element portions $l_6$ and $s_6$ is referenced K and the free end of the line element portion $s_6$ is referenced A. The connection point K is connected to a resistor $R_V$ which is connected via a feed through capacitor filter DF to the voltage terminal $U_{V+}$. The no-load condition at point A will, on account of the transformation properties of the line $l_6$ and $s_6$, appear at point B and thus on the varactor again as a no-load. The d.c. is fed to the short-circuit point K via the resistor $R_V$. The dimensioning of the line lengths of $l_6$ and $s_6$ is contrived to be such that the no-load/no-load transformation is fulfilled in the region of the desired middle frequency. The resistor $R_V$ is incorporated in such manner that it lies as close as possible to the short-circuit point K. It prevents the occurrence of parasitic impedance loops which stem from line element portions which are in resonance and which lead to the d.c. source. Impedance loops of a parasitic nature give rise to frequency jumps within the useful band during tuning. Therefore, the path of the line from the short-circuit point K to the feedthrough capacitor filter DF is a resistor and is selected to be as short as possible. In accordance with the network described here, the d.c. supplies of the oscillator are constructed at the emitter and at the base of the transistor T$r$.

Figure 2:
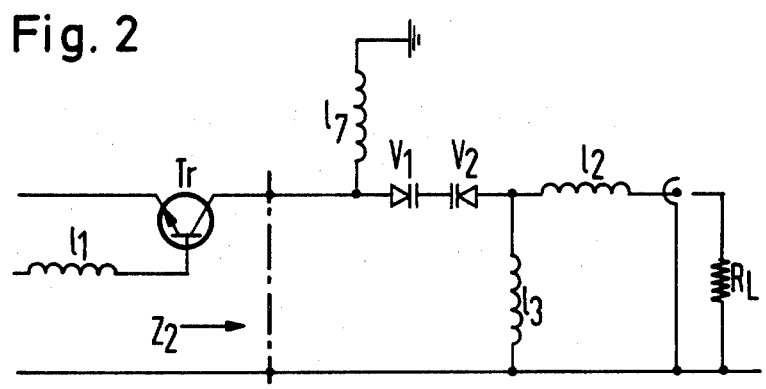
FIG. 2 is a schematic diagram illustrating the microwave portion with collector d.c. feedback of the oscillator.
Figure 3:
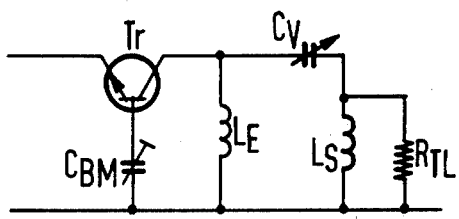
FIGS. 3 and 4 are equivalent circuit diagrams of the microwave portion.
Figure 4:
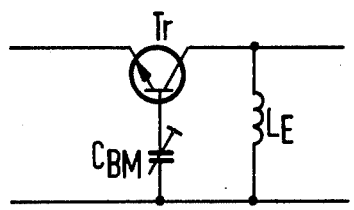

FIG. 2 shows the microwave portion of the oscillator with the collector d.c. feedback. The collector of the transistor T$r$ and the anode of the varactor V1 here are connected to earth with respect to the d.c. voltage. The feedback of the collector current from the transistor T$r$ and of the inverse current from the varactor V1 is effected in the simplest situation via a $\lambda/4$ line element portion $l_7$ which is short-circuited to earth. If the associated a.c. equivalent circuit diagram shown in FIG. 3 is considered, it will be seen that for small varactor capacitances, a microwave oscillating circuit whose circuit elements consist of the collector-base capacitance $C_{CB}$, the base-earth capacitance $C_{BM}$, and an equivalent inductance $L_E$ produced by the collector d.c. feedback can be excited at low frequencies. The transformed load resistance is referenced $R_{TL}$. During the electronic tuning of the oscillator in the direction of higher frequencies, the capacitance $C_V$ constantly reduces, so that increasingly one obtains the equivalent circuit shown in FIG. 4, for low frequencies at a reduced capacitance CV, which in fact contains only the capacitance $C_{BM}$ between the base and earth and the equivalent inductance $L_E$ between the collector and earth. In order to eliminate a possible frequency jumping of the oscillator, the parasitic microwave oscillating circuit is heavily damped. This is effected in accordance with the invention with the frequency-selective active attenuation network shown in FIG. 5, which is connected to the collector d.c. feedback and consists of the $\lambda/4$ line element portions $l_7$, $s_7$, $l_8$ and the attenuation resistor $R_D$. Here the $\lambda 4$ line element portion $l_7$ connected to the collector of the transistor $Tr$ is connected in series with the resistor $R_D$ and the resistor $R_D$ is connected in parallel with the short-circuited $\lambda/4$ line element portion $l_8$ in the jump frequency range. The other no-load line element portion $s_7$ is connected to the junction of the first line element portion $l_7$, and to the parallel connection of the resistor $R_D$ and the line element portion $l_8$.

The no-load line element portion $s_7$ and the parallel-connected, short-circuited line element portion $l_8$ form a parallel resonance in the region of half the middle frequency, i.e. the jump frequency band. This results since the resistor $R_D$ connected in series with the line element portion $l_7$ considerably damps the parasitic microwave oscillating circuit (see FIG. 5), and therefore prevents a possible frequency jumping of the oscillator outside of the useful band.

FIG. 6 shows the overall circuit diagram of the oscillator which is characterized by three networks: namely, the microwave portion with its frequency-determining elements; the HF choking network; and the frequency selective active attenuation network in the collector d.c. feedback of the transistor, all of which have been explained above. The microwave portion of the oscillator consists of the microwave transistor $Tr$, the varactors V1 and V2, and the line element portions $l_1$, $l_2$ and $l_3$. The associated a.c. equivalent circuit diagram, which contains the frequency-determining elements, is illustrated in FIG. 3 and has already been described in detail above. Here, the line element portion $l_1$ forms an additional capacitance $C_{BM}$; it is connected at one end to the base of the microwave transistor $Tr$. The collector of the microwave transistor $Tr$ is connected to the two series-connected oppositely poled varactor diodes V1, V2, which are connected in a series arm by the line element portion $l_2$ and in a shunt arm by the line element portion $l_3$ which forms the oscillating inductance $Ls$. The varactor diodes V1 and V2 can also be replaced by other capacitive elements.

Alternatively, the HF choking networks connected in the biasing circuits may be comprised of a $\lambda/4$ line element portion having an end short circuited by a blocking capacitor C as shown, for example, in the base biasing choking network shown in FIG. 6A.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. In a transistor oscillator for operation in a microwave frequency range having a transistor with a d.c. feedback means connected to the collector, a series connection of a capacitor and line element connected to the collector, and biasing means connected to the base, collector and emitter, wherein the improvement comprises the d.c. feedback means being provided as an attenuation network means for frequency selective action, the attenuation network means including a first $\lambda/4$ line element portion connected to a parallel circuit of an attenuation resistor and a second short-circuited line element portion connected in parallel thereto, a third no-load $\lambda/4$ line element portion being connected to the junction of the first line element portion and the parallel circuit and where $\lambda$ represents the wavelength of oscillation in a middle of the microwave frequency range.

2. The transistor oscillator as claimed in claim 1 having strip line technique high-frequency choking means connected to said biasing means, said choking means comprising two $\lambda/4$ line element portions.

3. The transistor oscillator of claim 1 having strip line technique high-frequency choking connected to said biasing means, said choking comprising one $\lambda/4$ line element portion having an end short-circuited by a blocking capacitor.

4. The transistor oscillator of claim 1 in which a line element portion for feedback is connected to the base.

5. The transistor oscillator of claim 2 in which one of said high-frequency choking means connects the bias means to the base and another connects the bias means to the emitter.

6. The transistor oscillator of claim 2 in which said capacitor is a varactor having its capacitance changed by a second bias means connected to the varicap by said high-frequency choking means.

7. The transistor oscillator of claim 2 in which said high frequency choking means comprises one of said $\lambda/4$ line element portions having no-load at one end and the other of said line element portions connecting to a damping resistor and feed-through capacitor.

8. A variable frequency microwave transistor oscillator for operation in a microwave frequency range comprising:
   a. a transistor;
   b. a variable frequency determining circuit connected to a first electrode of the transistor;
   c. bias means connected to first, second and third electrodes of the transistor; and
   d. an attenuation network means connected as d.c. feedback to the first electrode for damping by frequency selective action, said attenuation network means including a first $\lambda/4$ line element portion connected to a parallel circuit of an attenuation resistor and a second short-circuited line element portion connected in parallel thereto, a third no-load $\lambda/4$ line element portion being connected to the junction of the first line element portion and the parallel circuit and where $\lambda$ represents the wavelength of oscillation in a middle of the microwave frequency range.

9. The oscillator of claim 8 in which said bias means connects to said electrodes through strip line high frequency chokes comprising a $\lambda/4$ no-load first line element connected to a $\lambda/4$ second line element.